United States Patent
Wu et al.

(10) Patent No.: US 9,525,447 B1
(45) Date of Patent: Dec. 20, 2016

(54) RADIO RECEIVER CO-EXISTENCE

(71) Applicant: Broadcom Corporation, Irvine, CA (US)

(72) Inventors: Hao Wu, Los Angeles, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/858,826

(22) Filed: Sep. 18, 2015

(51) Int. Cl.
*H03D 7/16* (2006.01)
*H04B 1/26* (2006.01)
*H03D 7/14* (2006.01)

(52) U.S. Cl.
CPC ............ *H04B 1/26* (2013.01); *H03D 7/1441* (2013.01); *H03D 7/1466* (2013.01); *H03D 7/1491* (2013.01)

(58) Field of Classification Search
CPC ............ H04B 1/04; H04B 1/16; H04B 1/26; H04B 1/30; H04B 1/40; H04B 10/60; H03D 7/163; H03D 1/1466; H03D 9/00
USPC ......... 455/131, 132, 226.1, 230, 313, 552.1, 455/553.1
See application file for complete search history.

(56) References Cited

U.S. PATENT DOCUMENTS

| | | | |
|---|---|---|---|
| 6,426,680 B1 | 7/2002 | Duncan et al. | |
| 7,447,491 B2 * | 11/2008 | Khoini-Poorfard | H04B 1/30 455/553.1 |
| 8,233,871 B2 | 7/2012 | Keehr et al. | |
| 8,358,991 B2 * | 1/2013 | Chen | H04B 1/28 455/232.1 |

(Continued)

FOREIGN PATENT DOCUMENTS

KR 1991-0009206 11/1991

OTHER PUBLICATIONS

D. Murphy et al., Solid-State Circuits Conference Digest of Technical Papers (ISSCC), 2012 IEEE International; Date of Conference: Feb. 19-23, 2012; Murphy, D. Univ. of California, Los Angeles, Los Angeles, CA, USA, pp. 74-76, Product Type: Conference Publications.

(Continued)

*Primary Examiner* — Quochien B Vuong
(74) *Attorney, Agent, or Firm* — Sterne, Kessler, Goldstein & Fox P.L.L.C.

(57) ABSTRACT

Because of associated disadvantages of narrow-band off-chip radio-frequency (RF) filtering, a mixer-first receiver front-end designed to tolerate blockers with reduced gain compression and noise factor degradation is disclosed. The mixer-first receiver front-end includes two separate down-conversion paths that help to reduce added noise and voltage gain prior to baseband filtering, which are critical factors in eliminating narrow-band off-chip RF filtering. The mixer-first receiver front-end can be used to support down-conversion of multiple different communication signals (e.g., (Continued)

cellular, WLAN, and WPAN communication) with different center frequencies. In addition, where it is not possible to use a single, mixer-first receiver front-end to down-convert two different communication signals with potentially different center frequencies due to the need for both communication signals to be down-converted simultaneously, two mixer-first receiver front-ends can be efficiently used by sharing an antenna via a common RF port.

20 Claims, 9 Drawing Sheets

(56) References Cited

U.S. PATENT DOCUMENTS

| | | | |
|---|---|---|---|
| 8,379,766 B2* | 2/2013 | Lococo | H04B 1/1615 375/316 |
| 8,489,052 B2 | 7/2013 | Bult et al. | |
| 8,750,818 B2 | 6/2014 | Chung et al. | |
| 9,337,990 B2* | 5/2016 | Narahashi | H04B 1/525 |
| 2004/0219898 A1 | 11/2004 | Bult et al. | |
| 2007/0105504 A1 | 5/2007 | Vorenkamp et al. | |
| 2008/0009257 A1 | 1/2008 | Safarian et al. | |
| 2008/0139162 A1 | 6/2008 | Hafizi | |
| 2010/0267354 A1 | 10/2010 | Mirzaei et al. | |
| 2013/0303103 A1 | 11/2013 | Mikhemar et al. | |
| 2014/0036973 A1 | 2/2014 | Au et al. | |
| 2014/0045443 A1 | 2/2014 | Rofougaran et al. | |
| 2014/0171006 A1 | 6/2014 | Murphy et al. | |

OTHER PUBLICATIONS

European Search Report for EP Patent Application No. EP13003627.0, European Patent Office, Munich, Germany, mailed on Dec. 16, 2013.
Ru, Z., et al., "Digitally Enhanced Software-Defined Radio Receiver Robust to Out-of-Band Interference," IEEE Journal of Solid-State Circuits, Dec. 2009, pp. 3359-3375, vol. 44, No. 12.
Office Action directed to related Korean Patent Application No. 10-2013-0092113, mailed Feb. 5, 2015; 10 pages.
English-language abstract of Korean Patent Application Publication No. 1991-0009206; 1 page.

* cited by examiner

RADIO RECEIVER CO-EXISTENCE

TECHNICAL FIELD

This application relates generally to radio frequency (RF) receivers and, more specifically, to RF receiver co-existence.

BACKGROUND

There exist two commonly implemented front-end architectures in radio frequency (RF) receiver design; namely, the homodyne architecture and the heterodyne architecture. The homodyne architecture down-converts a desired channel directly from RF to baseband, whereas the heterodyne architecture down-converts a desired channel to one or more intermediate frequencies (IFs) before down-conversion to baseband. In general, each of these front-end architectures often employ an antenna to receive an RF signal, a low noise amplifier (LNA) to provide gain to the RE signal, and one or more down-conversion stages.

Each component in a receiver front-end, such as those mentioned above, contributes noise to the overall system. The noise of a component can be characterized by its noise factor (F), which is given by the ratio of the signal-to-noise ratio (SNR) at the input of the component to the SNR at the output of the component:

$$F_{COMPONENT} = SNR_{IN}/SNR_{OUT}$$

In general, the overall noise factor of the receiver front-end is proportional to the sum of each component's noise factor divided by the cascaded gain of preceding components and is given by $$F_{TOTAL} = F_1 + \frac{F_{2-1}-1}{A_1} + \frac{F_{3-1}-1}{A_1 A_2} + \ldots + \frac{F_{n-1}-1}{A_1 A_2 \ldots A_{n-1}}$$

where $F_n$ and $A_n$ respectively represent the noise factor and gain of the $n^{th}$ component in the receiver front-end. The above equation reveals that the noise factor $F_1$ and gain $A_1$ of the first gain component can have a dominant effect on the overall noise factor of the receiver front-end, since the noise contributed by each successive component is diminished by the cascaded gain of the components that precede it.

To provide adequate sensitivity, therefore, it is often important to keep the noise factor $F_1$ low and the gain $A_1$ high of the first gain component in the receiver front-end. The sensitivity of the receiver front-end determines the minimum signal level that can be detected and is limited by the overall noise factor of the receiver front-end. Thus, in many receiver designs the first gain component in the front-end is an LNA, which can provide high gain, while contributing low noise to the overall RF receiver.

LNAs provide relatively linear gain for small signal inputs. However, for sufficiently large input signals, LNAs can exhibit non-linear behavior in the form of gain compression; that is, for sufficiently large input signals, the gain of the LNA approaches zero. LNA gain compression is a common issue confronted in RF receiver design because large out-of-band interferers referred to as blockers can accompany a comparatively weak desired signal in a received RF signal. If these large out-of-band interferers are not attenuated prior to reaching the LNA, they can seriously affect the linearity of the LNA and degrade the sensitivity of the receiver front-end.

Therefore, a band-pass filter is conventionally employed in the receiver front-end, before the LNA, to attenuate large out-of-band interferers. These filters are typically mechanically-resonant devices, such as surface acoustic wave (SAW) filters, that provide a high quality factor (Q factor) required by many of today's communication standards. The Q-factor of a tuned circuit, such as a band-pass filter, is the ratio of its resonant frequency (or center frequency) to its 3 dB frequency bandwidth. SAW filters are generally not amenable to monolithic integration on a semiconductor substrate with the RF receiver. However, SAW filters remain conventional in many RF receiver designs because of the limited Q-factor of silicon-based inductors.

Although SAW filters can provide excellent attenuation of large out-of-band interferers and accurate pass-band location, they have several associated disadvantages. First, these filters have an approximate insertion loss of 1-2 dB in their pass-band. This directly adds to the noise factor and degrades sensitivity of the RF receiver. Second, these filters invariably add cost and circuit board area, especially in multi-band applications where several of these filters can be required (e.g., one for each supported band). Finally, the use of narrow-band off-chip SAW filters is not compatible with the concept of software-defined radios (SDRs), which continue to generate considerable interest for their associated advantages in power, speed, and flexibility.

For example, the trend in mobile devices has been, and continues to be, to combine many different types of wireless network communication capabilities into a single mobile device, including cellular network communication capabilities, wireless local area network communication capabilities, and personal area network communication capabilities (e.g., Bluetooth). Rather than adding a separate receiver front-end for every one of these wireless network communication capabilities (each of which may use a different portion of the radio spectrum), the use of flexible receiver hardware controlled by software can make the mobile device smaller, more power efficient, and cheaper. This trend of moving functionality into software is the basic idea of SDRs. SAW filters are not compatible with the concept of SDRs because they are narrow-band and their pass-bands are generally not programmable.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

Figure 1:
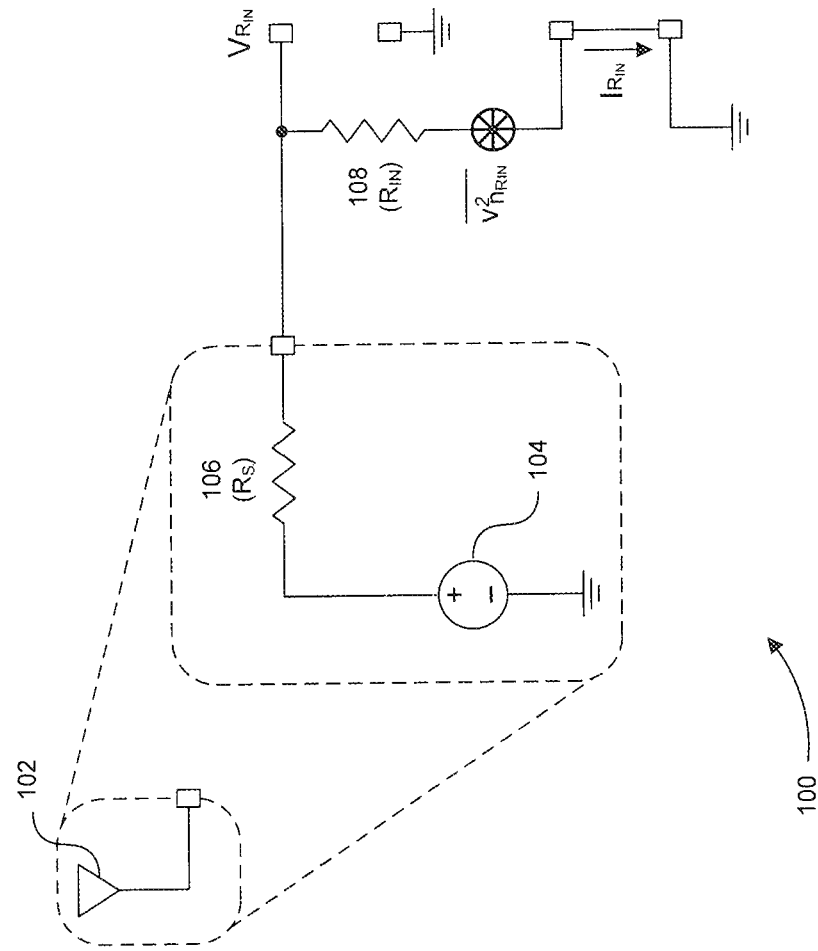
FIG. 1 illustrates a noise canceling technique as applied to a receiver front-end.

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of this discussion, the term "module" shall be understood to include software, firmware, or hardware (such as one or more circuits, microchips, processors, and/or devices), or any combination thereof. In addition, it will be understood that each module can include one, or more than one, component within an actual device, and each component that forms a part of the described module can function either cooperatively or independently of any other component forming a part of the module or node. Conversely, multiple modules described herein can represent a single component within an actual device. Further, components within a module can be in a single device or distributed among multiple devices in a wired or wireless manner.

1. OVERVIEW

Because of the associated disadvantages of narrow-band off-chip RF filtering mentioned above, a mixer-first receiver front-end designed to tolerate blockers with low levels of gain compression and noise factor degradation is described herein. The mixer-first receiver front-end includes two separate down-conversion paths that help to minimize added noise and voltage gain prior to baseband filtering, which are important factors in eliminating narrow-band off-chip RIF filtering as explained below. The mixer-first receiver front-end can be used to support down-conversion of multiple different communication signals (e.g., cellular, WLAN, and WPAN communication) with different center frequencies.

In addition, when it is not possible to use a single, mixer-first receiver front-end to down-convert two different communication signals with potentially different center frequencies due to the need for both communication signals to be down-converted simultaneously, two mixer-first receiver front-ends can be used that share an antenna via a common RF port. These and other features of the present disclosure are described further below.

2. MIXER-FIRST RECEIVER FRONT-END

In a mixer-first receiver front-end, down-conversion of a received RF signal is performed prior to any substantial filtering of the RF signal to remove blockers. Because the RF signal receives no substantial filtering to remove blockers prior to down-conversion, it is desirable that the front-end contribute low levels of voltage gain of the RF signal before, during, and after down-conversion until the down-converted signal can be filtered to remove blockers. Reducing voltage gain until the down-converted signal can be filtered helps to prevent gain compression of amplifying elements due to blockers. Furthermore, because the RF signal is to receive substantially no voltage gain prior to baseband filtering, it is desirable that low levels of noise be added to the RF signal before and during down-conversion so as not to overwhelm the information carried by the often weak RF signal.

The mixer-first receiver front-end of the present disclosure includes two separate down-conversion paths that help to reduce added noise and voltage gain prior to baseband filtering, thereby allowing narrow-band off-chip RF filtering to be dispensed with. Before discussing specific embodiments of the mixer-first receiver front-end of the present disclosure, a noise canceling technique utilized by the mixer first receiver front-end is described.

FIG. 1 specifically illustrates the concept of the noise canceling technique utilized by the mixer-first receiver front-end of the present disclosure. As shown in FIG. 1, a receiver front-end 100 includes an antenna 102, which can be represented by a voltage source 104 in series with a source output resistance ($R_S$) 106, and an input resistance ($R_{IN}$) 108. Input resistance 108 is typically adjusted to match source output resistance 106 associated with antenna 102. Providing a matching resistance (commonly referred to as impedance matching) helps to avoid signal reflections and maximize power transfer from antenna 102 to the other down-stream elements of receiver front-end 100. However, as with all resistive elements, input resistance 108 generates thermal noise that can overwhelm the often weak RF signal received by antenna 102. The thermal noise generated by input resistance 108 is shown in FIG. 1 as a series voltage source with a mean square value of $$\overline{v_{n_{R_{IN}}}^2}.$$

Receiver front-end 100 includes two gain paths to cancel the thermal noise generated by input resistance 108. The first gain path includes a voltage controlled voltage source 110 that provides a first output voltage $V_{OUT1}$ equal to the voltage $V_{R_{IN}}$, measured between source input resistance 106 and input resistance 108, multiplied by some gain α. The second gain path includes a current controlled voltage source 112 that provides a second output voltage $V_{OUT2}$ equal to the current $I_{R_{IN}}$, flowing through input resistance 108, multiplied by some gain $r_m$.

It can be shown that the thermal noise generated by input resistance 108 appears in both the voltage $V_{R_{IN}}$ and the current $I_{R_{IN}}$ 180 degrees out of phase with each other, while the RF signal received by antenna 102 appears in both the voltage $V_{R_{IN}}$ and the current $I_{R_{IN}}$ in-phase with each other. Given this, $r_m$ and α can be determined to adjust the magnitude of the two voltage signals $V_{OUT1}$ and $V_{OUT2}$ such that, when $V_{OUT1}$ and $V_{OUT2}$ are added together (or potentially sensed differentially depending on the relative polarities of α and $r_m$), the thermal noise generated by input resistance 108 is substantially canceled, while the RF signal received by antenna 102 is reinforced. For example, based on the exemplary configuration of front-end 100 illustrated in FIG. 1, by setting $r_m$ equal to $-α*R_S$, the magnitude of the two voltage signals $V_{OUT1}$ and $V_{OUT2}$ are adjusted such that, when $V_{OUT1}$ and $V_{OUT2}$ are added together (or potentially sensed differentially depending on the relative polarities of α and $r_m$), the thermal noise generated by input resistance 108 is substantially canceled, while the RF signal received by antenna 102 is reinforced.

Figure 2:
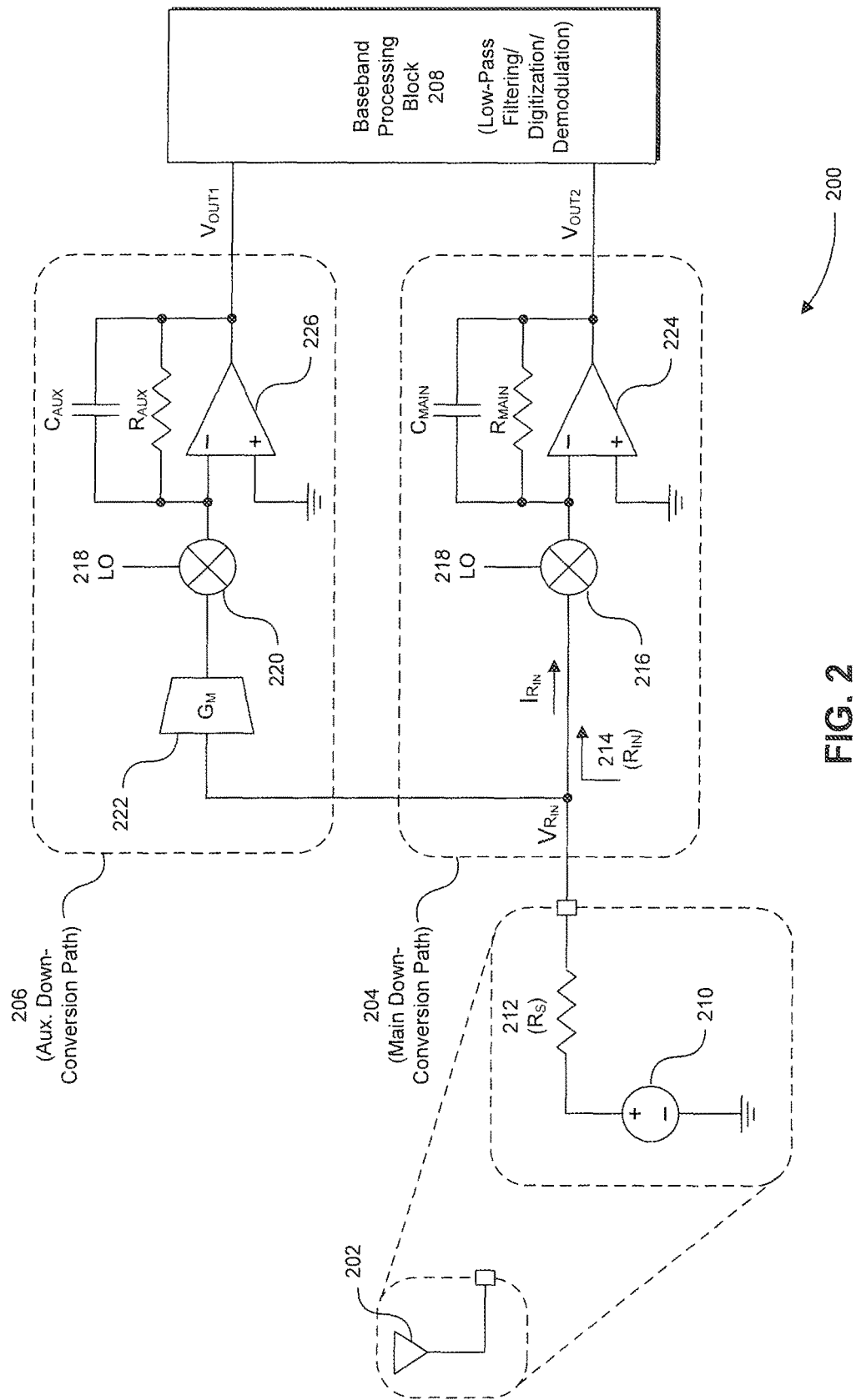
FIG. 2 illustrates a mixer-first receiver front-end with two separate down-conversion paths that exploits the noise canceling technique illustrated in FIG. 1 in accordance with embodiments of the present disclosure.

FIG. 2 illustrates a mixer-first receiver front-end 200 in accordance with embodiments of the present disclosure that utilizes the above described noise canceling technique. Mixer-first receiver front-end 200 can be used in several different devices to receive wireless RF signals, such as cell phones, laptops, wearable devices, etc. As shown in FIG. 2, mixer-first receiver front-end 200 includes an antenna 202, two down-conversion paths 204 and 206, and a baseband processing block 208. Antenna 202 can be represented by a voltage source 210 in series with a source output resistance ($R_S$) 212, which is, for example, 50 Ohms. Source output resistance 212 is matched by an input resistance ($R_{IN}$) 214 to avoid signal reflections and maximize power transfer from antenna 202 to the other down-stream elements of mixer-first receiver front-end 200. Input resistance 214 is provided, at least in part, by the elements of main down-conversion path 204 shown in FIG. 2.

In operation, the two down-conversion paths 204 and 206 down-convert an RF signal received by antenna 202 to baseband or some IF and utilize the above described noise canceling technique in FIG. 1 to substantial cancel thermal noise generated by input resistance 214, while substantially avoiding voltage gain of the RF signal. Main down-conversion path 204 includes a passive mixer 216 to down-convert the current signal $I_{R_{IN}}$ by an amount substantially equal to the frequency of a local oscillator signal (LO) 218. The current signal $I_{R_{IN}}$ includes both the RF signal received by antenna 202 and the thermal noise signal generated by input resistance 214.

Auxiliary down-conversion path 206 includes a passive mixer 220 to down-convert the voltage signal $V_{R_{IN}}$ measured between source input resistance 212 and input resistance 214 by an amount substantially equal to the frequency of the same LO signal 218 used by passive mixer 216. The frequency of LO signal 218 can be tuned, for example, based on a position of a desired channel in the spectrum of the received RF signal. Like the current signal $I_{R_{IN}}$, the voltage signal $V_{R_{IN}}$ includes both the RF signal received by antenna 202 and the thermal noise signal generated by input resistance 214. An additional transconductance cell ($G_M$) 222 is included in auxiliary down-conversion path 206 to first convert the voltage signal $V_{R_{IN}}$ into a corresponding current signal. Transconductance cell 222 can be implemented, for example, as an inverter.

Although the thermal noise signal and the RF signal appear in both the current signal $I_{R_{IN}}$ and the voltage signal $V_{R_{IN}}$, as noted above in FIG. 1, it can be shown that the thermal noise signal in $V_{R_{IN}}$ is 180 degrees out of phase with the thermal noise signal in $I_{R_{IN}}$, while the RF signal in $V_{R_{IN}}$ is in-phase with the RF signal in $I_{R_{IN}}$. Given this, transimpedance operational amplifiers 224 and 226 can be respectively used to convert and scale the down-converted current signals at the output of passive mixers 218 and 220, into two voltage signals $V_{OUT1}$ and $V_{OUT2}$ such that, when $V_{OUT1}$ and $V_{OUT2}$ are added together (or potentially sensed differentially depending on the relative polarities of the gains applied by the transfer functions), the thermal noise generated by input resistance 214 is substantially canceled, while the RF signal received by antenna 202 is reinforced.

In general, the transfer functions of transimpedance operational amplifiers 224 and 226 are determined based on their feedback networks. In at least one embodiment, transimpedance operational amplifiers 224 and 226 include a resistive element and a capacitive element in parallel in their feedback networks, as shown in FIG. 2. The capacitive elements $C_{MAIN}$ and $C_{AUX}$ can be included for stability purposes and the resistive elements $R_{MAIN}$ and $R_{AUX}$ can be included to set a current-to-voltage conversion gain for transimpedance operational amplifiers 224 and 226, respectively. Without loss of generality, if capacitive elements $C_{MAIN}$ and $C_{AUX}$ are ignored, it can be shown that the current-to-voltage conversion gains are substantially equal to $-R_{MAIN}$ and $-R_{AUX}$, assuming that transimpedance operational amplifiers 224 and 226 have sufficient open-loop gains.

Based on the exemplary configuration of mixer-first receiver front-end 200 illustrated in FIG. 2, by setting $R_{MAIN}$ equal to $-R_{AUX}*R_S$, the magnitude of the two voltage signals $V_{OUT1}$ and $V_{OUT2}$ are produced such that, when $V_{OUT1}$ and $V_{OUT2}$ are added together (or potentially sensed differentially depending on the relative polarities of α and $r_m$), the thermal noise generated by input resistance 214 is substantially canceled, while the RF signal received by antenna 202 is reinforced. However, other settings for $R_{MAIN}$ and $R_{AUX}$ are possible and can be used for other RF receiver front-end configurations.

By employing passive mixers 216 and 220 (which are bidirectional) and transimpedance operational amplifiers 224 and 226, the virtual ground at the negative summing nodes of transimpedance operational amplifiers 224 and 226 appears ideally at the RF side of passive mixers 216 and 220 where the RF signal from antenna 202 is received, thereby suppressing voltage swing prior to baseband or IF filtering to remove blockers. Thus, because mixer-first receiver front-end 200 suppresses noise, while minimizing voltage gain, mixer-first receiver front-end 200 can be considered blocker-tolerant. In addition, because passive mixer 216 is bidirectional, the noise of the transimpedance operational amplifier 224 up-converts at the input of mixer-first receiver front-end 200 and is canceled along with the thermal noise generated by input resistance 214. The noise of transimpedance operational amplifier 226 contributes negligibly when driven by a current source-like transconductance cell 222.

Following down-conversion of the RF signal received by antenna 202 by down-conversion paths 204 and 206 as described above, baseband processing block 208 processes $V_{OUT1}$ and $V_{OUT2}$ using one or more processors and/or circuits. For example, baseband processing block 208 can low-pass filter $V_{OUT1}$ and $V_{OUT2}$, either separately or after having been added (or subtracted) together, to remove blockers and other interference. In addition, baseband processing block 208 can further perform digitization of $V_{OUT1}$ and $V_{OUT2}$, either separately or after having been added (or subtracted) together, using one or more analog-to-digital converters (ADCs). The ADCs can be, for example, delta-sigma ADCs. In addition, baseband processing, block 208 can perform low-pass filtering and digitization of $V_{OUT1}$ and $V_{OUT2}$ in any order relative to each other. Further, baseband processing block 208 can demodulate the down-converted RF signal contained within $V_{OUT1}$ and $V_{OUT2}$ to recover information.

3. MIXER-FIRST RECEIVER FRONT-END WITH HARMONIC REJECTION MIXERS

LO signal 218 used by passive mixers 216 and 220 in FIG. 2 to down-convert a received RF signal typically approximates a square waveform. Unlike a single-tone sinusoidal waveform, a square waveform contains harmonics at odd multiples of the fundamental frequency of the LO signal. Consequently, undesired portions of the RF signal located at these harmonics can be down-converted by passive mixers 216 and 220 and interfere with a desired portion of the RF signal at baseband.

Figure 3:
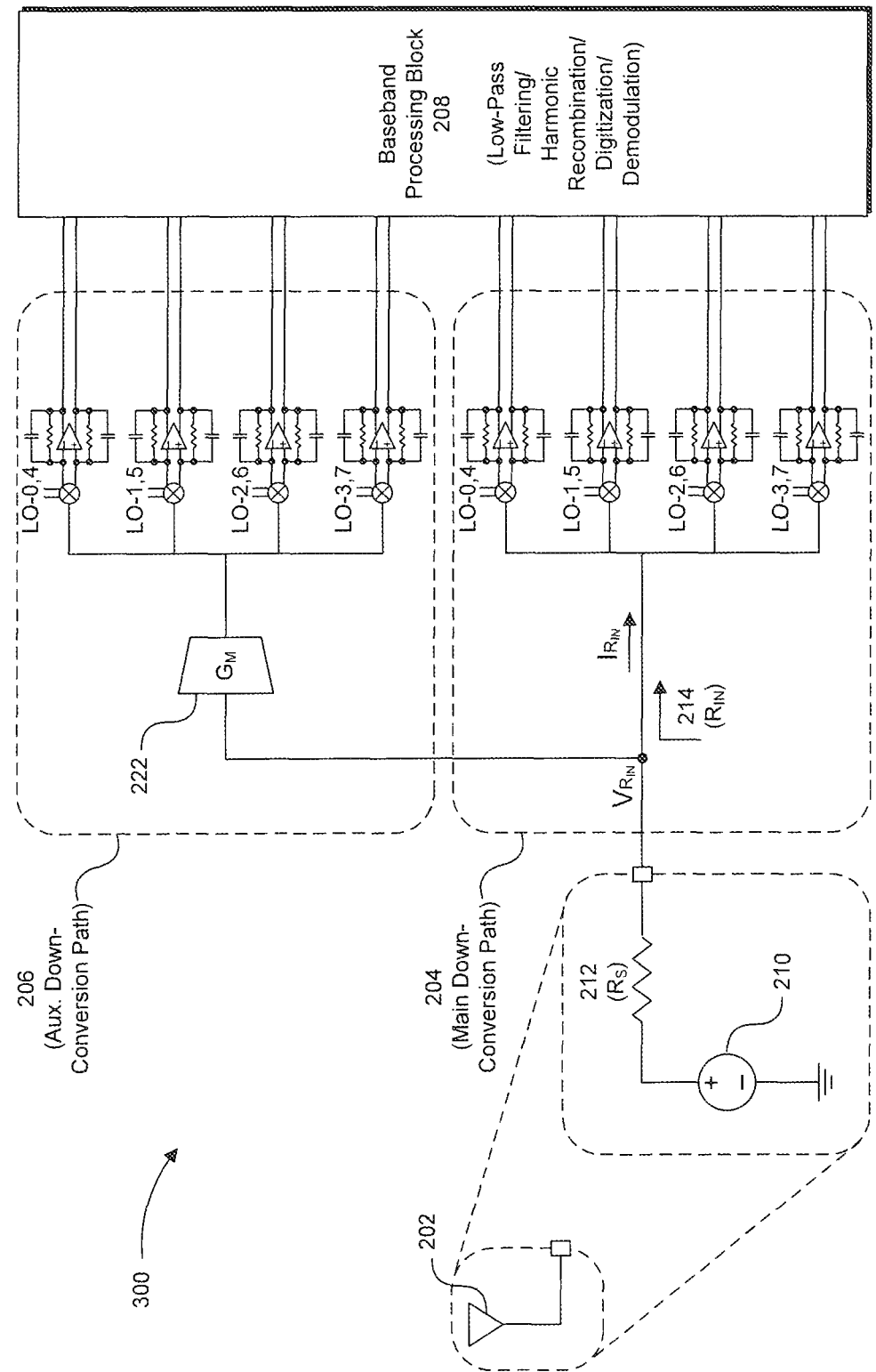
FIG. 3 illustrates a mixer-first receiver front-end designed to limit interference caused by higher-order harmonic effects in accordance with embodiments of the present disclosure.

FIG. 3, described below, provides a mixer-first receiver front-end 300 designed to limit interference caused by these higher-order harmonic effects in accordance with embodiments of the present disclosure. Mixer-first receiver front-end 300 includes the same basic structure as mixer-first receiver front-end 200 illustrated in FIG. 2. However, passive mixers 216 and 220 respectively included in down-conversion paths 204 and 206 have each been replaced by an eight-phase passive harmonic rejection mixer constructed from four single-balanced passive mixers. Correspondingly, transimpedance operational amplifiers 224 and 225 have each been replaced with four transimpedance operational amplifiers that are each coupled to a respective one of the single-balanced passive mixers. It should be noted that, in other embodiments, lower or higher order passive harmonic rejection mixers can be used, including six-phase or four-phase passive harmonic rejection mixers.

Figure 4:
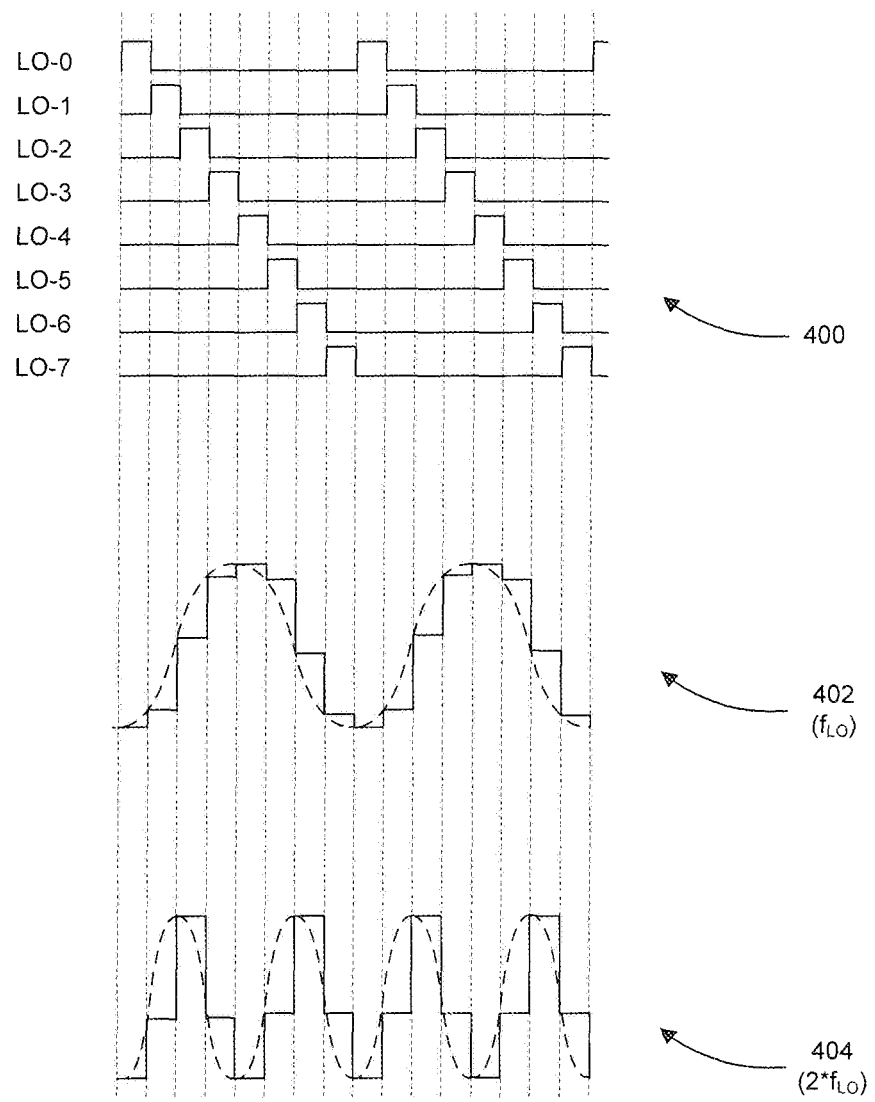
FIG. 4 illustrates a waveform diagram of exemplary LO signals for use in an eight-phase harmonic rejection mixer in accordance with embodiments of the present disclosure.

As shown in FIG. 3, the four single-balanced passive mixers included in each down-conversion path 204 and 206 receive a respective set of LO signals. The first respective passive mixer in down-conversion paths 204 and 206 receives LO signals 0 and 4, the second respective passive mixer in down-conversion paths 204 and 206 receives LO signals 1 and 5, the third respective passive mixer in down-conversion paths 204 and 206 receives LO signals 2 and 6, and the fourth respective passive mixer in down-conversion paths 204 and 206 receives LO signals 3 and 7. Exemplary waveforms 400 for the LO signals 0-7 are shown in FIG. 4. As shown in FIG. 4, the exemplary LO signals are non-overlapping and have a duty-cycle substantially equal to 12.5%. It can be shown that, by appropriately weighting each output of the four transimpedance operational amplifiers in down-conversion path 204 and combining the weighted outputs, the amount of noise that folds down to baseband as a result of higher-order harmonic effects discussed above can be reduced and/or nulled. The same weighting and combining can be performed for down-conversion path 206 to reduce the amount of noise that folds down to baseband as a result of higher-order harmonic effects. The weighting and recombination can be performed by baseband processing block 208.

FIG. 4 further illustrates that the effective result of the appropriate weighting and combining is that the LO signals 0-7 form a single staircase LO signal 402 that better approximates a sine wave with a frequency equal to the fundamental frequency of the LO signals 0-7. It can be shown that staircase signal 402 is free from the third and fifth harmonic as a result of the better approximation. In addition, FIG. 4 further illustrates that it is possible to change the weightings such that the effective result of the weighting and combining is that the LO signals 0-7 form a single staircase LO signal 404 that approximates a sine wave with a frequency equal to twice the fundamental frequency of the LO signals 0-7. However, the approximation is not as good as the approximation of staircase signal 402 to its corresponding sine wave.

4. PASSIVE MIXERS

Figure 5:
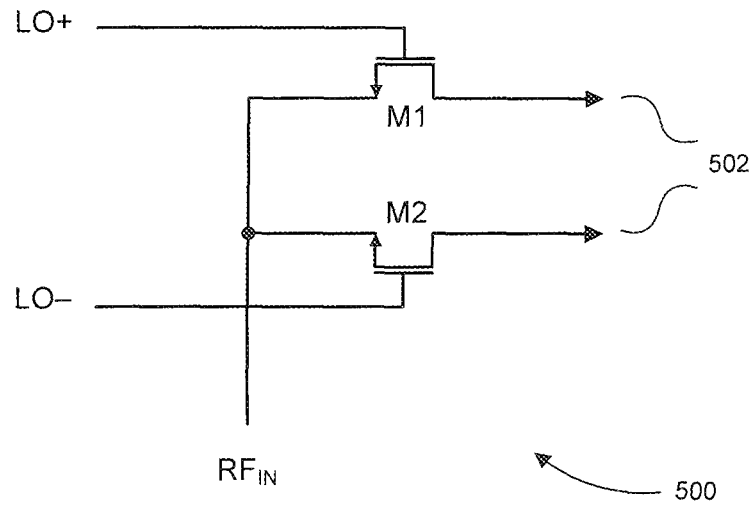
FIG. 5 illustrates a single-balanced passive mixer in accordance with embodiments of the present disclosure.

FIG. 5 illustrates an exemplary implementation of a single-balanced passive mixer 500 that can be used to implement the single-balanced passive mixers shown in FIG. 2 FIG. 3. Single-balanced passive mixer 500 includes switching devices M1 and M2. In an embodiment, switching devices M1 and M2 are metal-oxide semiconductor field effect transistors (MOSFETs). Specifically, switching devices M1 and M2 are n-channel MOSFETs (NMOS). However, as will be appreciated by one of ordinary skill in the art, switching devices M1 and M2 can be implemented using other suitable switching devices. In the embodiment of FIG. 5, switches M1 and M2 are operated substantially in their linear region when ON.

In operation, single-balanced passive mixer 500 receives a differential LO signal that has a frequency of $\omega_{LO}$. The gate of switching device M1 is coupled to the positive end of the LO signal (LO+), and the gate of switching device M2 is coupled to the negative end of the LO signal (LO−). Because the LO signal is differential and its two ends are substantially 180-degrees out of phase, switching devices M1 and M2 are switched ON and OFF at different times at the frequency of the LO signal ($\omega_{LO}$). The switching of transistors M1 and M2 at different times at a frequency of $\omega_{LO}$ effectively multiplies the RE input signal ($RF_{IN}$), coupled to the sources of switching devices M1 and M2, by ±1. This effective multiplication results in frequency conversion of the RF input signal by the sum ($\omega_{RF}+\omega_{LO}$) and difference ($\omega_{RF}-\omega_{LO}$ or $\omega_{LO}-\omega_{RF}$) in frequency between the LO signal and the RF input signal. The frequency-converted RF input signal is provided differentially at an output 502.

The use of single-balanced passive mixer 500 effectively removes any DC offset component of the LO signal. Removal of the DC component helps to reduce undesired feed-through of the RF input signal at output 502 of single-balanced passive mixer 500.

Figure 6:
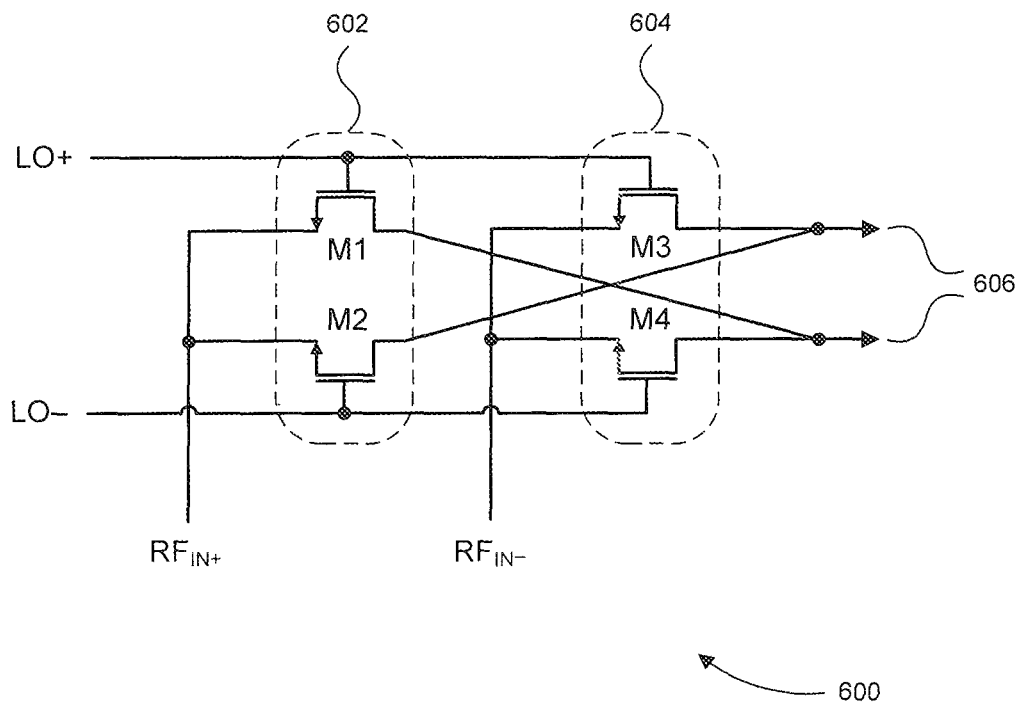
FIG. 6 illustrates a double-balanced passive mixer in accordance with embodiments of the present disclosure.

FIG. 6 illustrates an exemplary implementation of a double-balanced passive mixer 600 that can be used to implement the passive mixers in the receiver front-end 300 of FIG. 3 when a fully differential receiver front-end is desired.

Double-balanced passive mixer 600 includes switching devices M1, M2, M3, and M4. In an embodiment, switching devices M1-M4 are metal-oxide semiconductor field effect transistors (MOSFETs). Specifically, switching devices M1-M4 are n-channel MOSFETs (NMOS). However, as will be appreciated by one of ordinary skill in the art, switching devices M1-M4 can be implemented using other suitable switching devices. In the embodiment of FIG. 6, switches M1-M4 are operated substantially in their linear region when ON.

In operation, double-balanced passive mixer 600 receives a differential LO signal that has a frequency of $\omega_{LO}$. Double-balanced mixer 600 is essentially formed from two single-balanced passive mixers 602 and 604. The gates of switching devices M1 and M3 are coupled to the positive end of the LO signal (LO+), and the gates of switching, devices M3 and M4 are coupled to the negative end of the LO signal (LO−). Because the LO signal is differential and its two ends are substantially 180-degrees out of phase, switching device pair M1 and M2 and switching device pair M3 and M4 are switched ON and OFF at different times at the frequency of the LO signal ($\omega_{LO}$). The switching at a frequency of $\omega_{LO}$ effectively multiplies the positive RF input signal ($RF_{IN+}$), coupled to the sources of switching devices M1 and M2, and the negative RF input signal ($RF_{IN-}$), coupled to the sources of switching devices M3 and M4, by ±1. This effective multiplication results in frequency conversion of the differential RF input signal by the sum ($\omega_{RF}+\omega_{LO}$) and difference ($\omega_{RF}-\omega_{LO}$ or $\omega_{LO}-\omega_{RF}$) in frequency between the in-phase LO signal and the differential RF input signal. The frequency-converted RF input signal is provided differentially at an output 606.

The use of double-balanced passive mixer 600 effectively removes any DC offset component of the LO signal, as well as any DC offset component of the differential RF input signal. Removal of the DC components helps to reduce undesired feed-through of the RF input signal and the LU signal at output 606 of double-balanced passive mixer 600.

5. LOW-PASS FILTER

Figure 7:
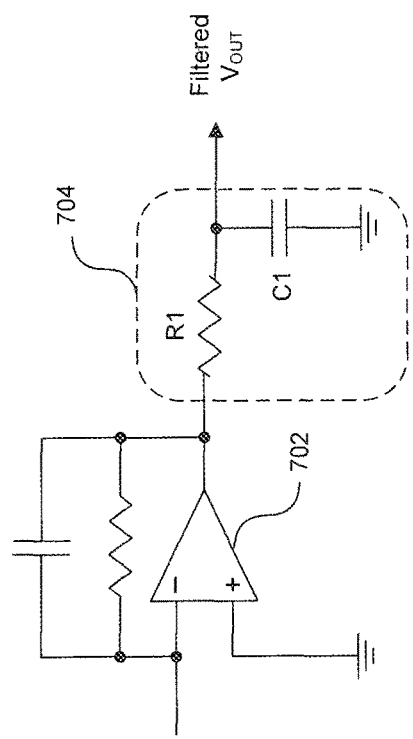
FIG. 7 illustrates exemplary single-ended low-pass filter in accordance with embodiments of the present disclosure.

FIG. 7 illustrates an exemplary implementation of a low-pass filter that can be used in a mixer-first receiver front-end as disclosed above. Specifically, FIG. 7 illustrates a single-ended transimpedance operational amplifier 702 that can be, for example, one of single-ended transimpedance operational amplifiers 224 and 226 shown in FIG. 2, and a low-pass filter 704. Low-pass filter 704 can be used to attenuate interferers or blockers in the down-converted signal provided as output from one of transimpedance operational amplifiers 224 and 226.

Low-pass filter 704 specifically includes a resistor R1 and a capacitor C1 and the filtered output of the low-pass filter 704 is taken between the series coupling of R1 and C1. The resistor R1 and capacitor C1 are determined so as to exclude one or more blockers from the pass band of low-pass filter 704. In one embodiment, the resistor R1 and/or the capacitor C1 are made programmable, such that characteristics of the pass-band of the low-pass filter can be adjusted.

It should be noted that, when low-pass filter 704 is used in a mixer-first receiver front-end similar to the one shown in FIG. 3 that implements harmonic rejection mixers, a respective low-pass filter 704 can be placed at the output of each transimpedance operational amplifier or low-pass filter 704 can be used to filter the signals after harmonic recombination is performed. In the latter instance, one or two (where there is in-phase and quadrature components) low-pass filters 704 can be used. It should be further noted that, in other embodiments, low-pass filter 704 can be replaced by a switched capacitor filter implementing a low-pass function. The switching frequency of such a filter can be made programmable to adjust the pass-band of the filter.

Figure 8:
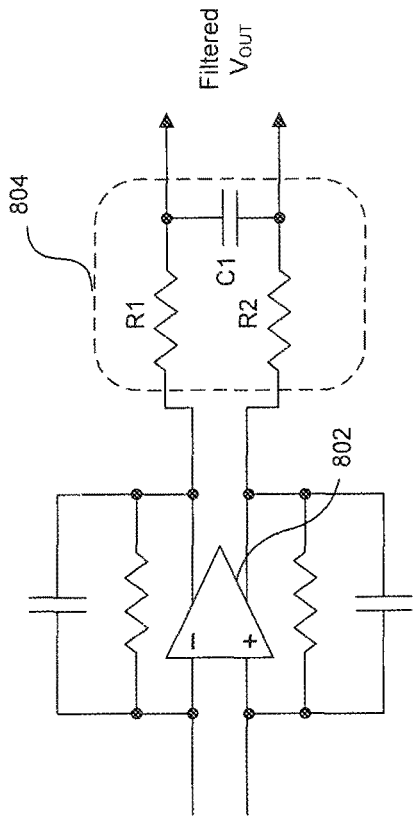
FIG. 8 illustrates an exemplary differential low-pass filter in accordance with embodiments of the present disclosure.

FIG. 8 illustrates another exemplary implementation of a low-pass filter that can be used in a mixer-first receiver front-end as disclosed above. Specifically, FIG. 8 illustrates a differential transimpedance operational amplifier 802 that can be, for example, one of the differential transimpedance operational amplifiers shown in FIG. 3, and a differential low-pass filter 804. Differential low-pass filter 804 can be used to attenuate interferers or blockers in the down-converted signal provided as output from one of transimpedance operational amplifiers shown in FIG. 3.

Differential low-pass filter 804 specifically includes resistors R1 and R2 and a capacitor C1, and the filtered output of differential low-pass filter 804 is taken as shown in FIG. 8. In one embodiment, the resistors R1 and R2 and/or the capacitor C1 are made programmable, such that characteristics of the pass-band of the low-pass filter can be adjusted.

It should be noted that, when low-pass filter 804 is used in a mixer-first receiver front-end similar to the one shown in FIG. 3 that implements harmonic rejection mixers, a respective differential low-pass filter 804 can be placed at the output of each transimpedance operational amplifier or differential low-pass filter 804 can be used to filter the signals after harmonic recombination is performed. In the latter instance, one or two (where there is in-phase and quadrature components) differential low-pass filters 804 can be used. It should be further noted that, in other embodiments, low-pass filter 804 can be replaced by a switched capacitor filter implementing a low-pass function. The switching frequency of such a filter can be made programmable to adjust the pass-band of the filter.

6. CO-EXISTENCE OF MIXER-FIRST RECEIVER FRONT-ENDS THAT SHARE AN ANTENNA VIA A COMMON RF PORT

The above described mixer-first receiver front-end eliminates the need for narrow-band off-chip RF filtering and can therefore be used to support down-conversion of multiple different communication signals (e.g., cellular, WLAN, and WPAN communication signals) each with a potentially different center frequency. However, in many applications, two different communication signals with potentially different center frequencies need to be down-converted simultaneously by a device. For example, many laptops and smart phones are required to communicate over a WLAN (employing one the IEEE 802.11 specifications) and a WPAN (employing the Bluetooth specification) at the same time.

Although a single mixer-first receiver front-end can be used to support down-conversion of multiple different communication signals each with a potentially different center frequency, a single mixer-first receiver front-end generally cannot provide such down-conversion support to two communication signals simultaneously. In an application where two different communication signals need to be down-converted simultaneously, two mixer-first receiver front-ends can be efficiently used by sharing an antenna via a common RF port as will be explained below.

Figure 9:
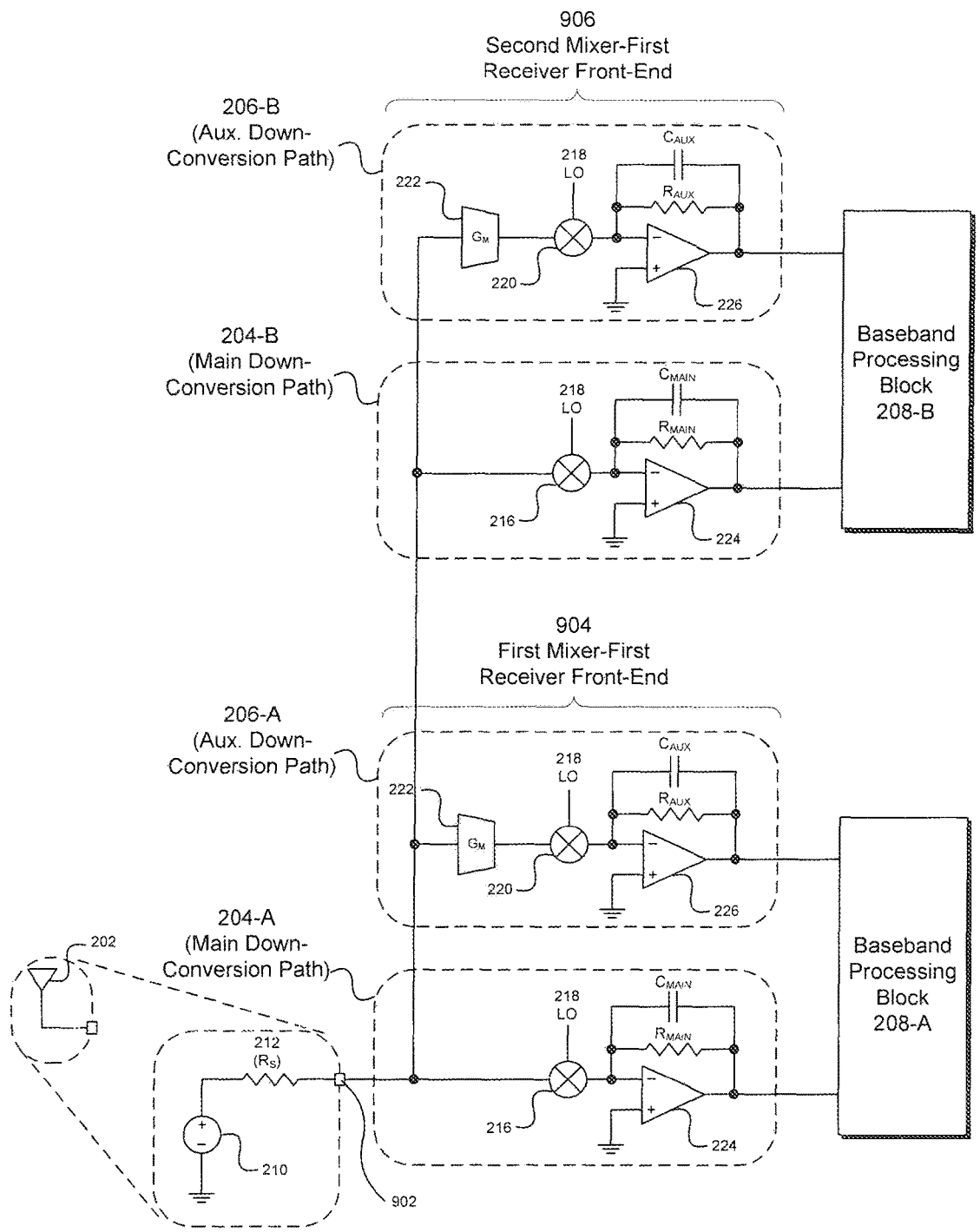
FIG. 9 illustrates two mixer-first receiver front-ends that share an antenna via a common an RF port in accordance with embodiments of the present disclosure.

For example, FIG. 9 illustrates two mixer-first receiver front-ends that share an antenna via a common RF port and that can support simultaneous down-conversion of two different communication signals in accordance with embodiments of the present disclosure. In particular, the first mixer-first receiver front-end 904 includes a main down-conversion path 204-A and an auxiliary down-conversion path 206-A, and the second mixer-first receiver front-end 906 includes a main down-conversion path 204-B and an auxiliary down-conversion path 206-B. The two mixer-first receiver front-ends 904 and 906 are shown in FIG. 9 as having the same general configuration as mixer-first receiver front-end 200 illustrated in FIG. 2. However, it will be appreciated by one of ordinary skill in the art that either mixer-first receiver front-end 904 or 906 in FIG. 9, or both, can be implemented using the configuration of mixer-first receiver front-end 300 illustrated in FIG. 3.

The two mixer-first receiver front-ends 904 and 906 share an antenna 202 via a common RF port 902. The architecture shown in FIG. 9 works well when only one of the two mixer-first receiver front-ends 904 and 906 is active (e.g., is being used to down-convert a communication signal). This is because the main down-conversion path of the non-active mixer-first receiver front-end can be disconnected from RF port 902 such that the non-active mixer-first receiver front-end has a substantially infinite input impedance as seen by RF port 902. The main down-conversion path of the non-active mixer-first receiver front-end can be disconnected from RF port 902 in several different ways, including by disabling the switch or switches (e.g., switches M1-M4 in FIG. 5 and FIG. 6) used by passive mixer 216 in the main down-conversion path of the non-active mixer-first receiver front-end. The disabled switch or switches used by passive mixer 216 remain open and, therefore, disconnect the main down-conversion path of the non-active mixer-first receiver front-end from RF port 902.

However, when both mixer-first receiver front-ends 904 and 906 are active at the same time, the two mixer-first receiver front-ends 904 and 906, and their associated input impedances, are coupled in parallel to RF port 902. Assuming each mixer-first receiver front-end 904 and 906 provides the same input impedance (typically 50 Ohms to match the impedance of antenna 202), the current of the signal received at RF port 902 from antenna 202 will be divided equally between the two mixer-first receiver front-ends, which equates to an immediate 6 dB loss for each mixer-first receiver front-end 904 and 906. It is noted that the input impedance of each mixer-first receiver front-end 904 and 906 results substantially from their respective main down-conversion paths 204-A and 204-B (e.g., passive mixers 216 and transimpedance amplifiers 224). In addition to the 6 dB loss, there is also no isolation between the two mixer-first receiver front-ends 904 and 906. Because of these two issues, one or both of the mixer-first receiver front-ends 904 and 906 may not provide a down-converted signal with a high enough signal-to-noise ratio (SNR) to allow proper recovery of data within the down-converted signal.

As a solution, when both mixer-first receiver front-ends 904 and 906 are active at the same time or anticipated to be active at the same time, the main down-conversion path 204-B of second mixer-first receiver front-end 906 can be disconnected from RF port 902 such that main down-conversion path 204-B has a substantially infinite input impedance as seen by RF port 902. Both down-conversion paths 204-A and 206-A of first mixer-first receiver front 904 can be kept active, while auxiliary down-conversion path 206-B of second mixer-first receiver front-end 906 remains active to down-convert the signal received at RF port 902 from antenna 202. Because auxiliary down-conversion path 206-B measures the voltage of the signal received at RF port 902 from antenna 202 using a transconductance cell ($G_M$) 222 that has a large input impedance, auxiliary down-conversion path 206-B does not provide any significant loss to the current of the signal received at RF port 902 from antenna 202 used by main down-conversion path 204-A of first mixer-first receiver front-end 904 in FIG. 9.

As a consequence of this solution, first mixer-first receiver front-end 904 should perform well, but second mixer-first receiver front-end 906 will generally see noise from main-down conversion path 204-A of first mixer-first receiver front-end 904. To help second mixer-first receiver front-end 906 combat the noise from main-down conversion path 204-A of first mixer-first receiver front-end 904, the input impedance of main-down conversion path 204-A as seen by RF port 902 can be increased. A higher input impedance of main-down conversion path 204-A will result in a higher signal voltage at transconductance cell 222 of auxiliary down-conversion path 206-B. At the same time it is noted that a higher input impedance of main-down conversion path 204-A will result in increased signal loss at main down-conversion path 204-A of first mixer-first receiver front-end 904 due to imperfect matching. But after noise cancellation, the signal-to-noise ratio (SNR) of first mixer-first receiver front-end 904 will generally not be affected as a result of this increased input impedance.

In one embodiment, the input impedance of main-down conversion path 204-A is increased by a fixed amount that is designed to allow both mixer-first receiver front-ends to properly down-convert the signal received at RF port 902 from antenna 202 as specified by their respective communication standards. In another embodiment, the input impedance of main-down conversion path 204-A is increased by an adaptive amount that changes based on a signal-to-noise ratio (SNR) or signal-to-interference-plus-noise ratio (SINR) of the signal received at RF port 902 from antenna 202.

Figure 10:
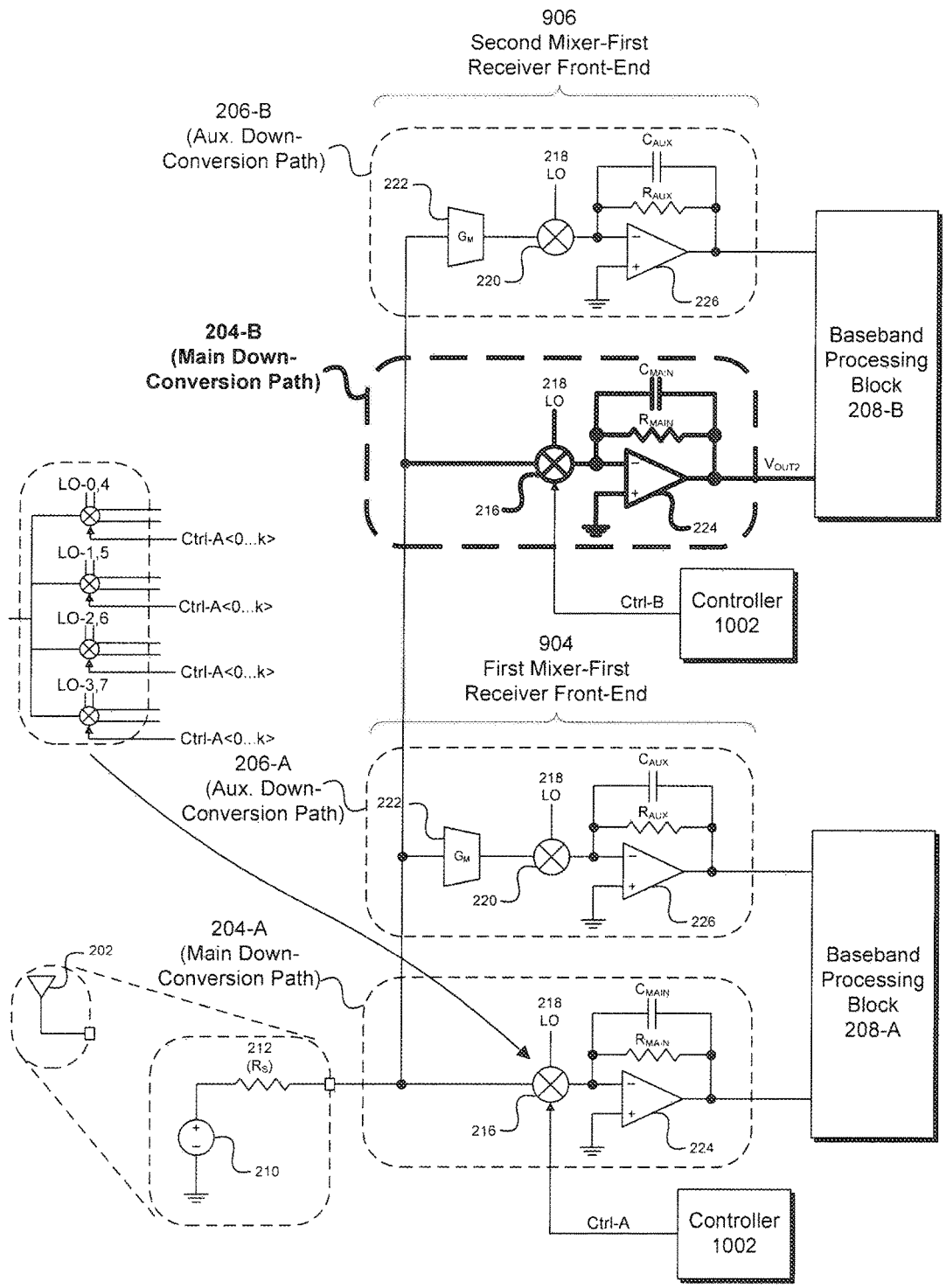
FIG. 10 illustrates two mixer-first receiver front-ends that share an antenna via a common RF port in accordance with embodiments of the present disclosure.

FIG. 10 illustrates the two mixer-first receiver front-ends 904 and 906 as configured when both are active at the same time or anticipated to be active at the same time. In particular, a controller 1002 is configured to disconnect main-down conversion path 204-B from RF port 902 and, potentially, increase the input impedance of main down-conversion path 204-A as seen by RF port 902.

Main down-conversion path 204-B can be disconnected from RF port 902 by controller 1002 in several different ways, including by disabling the switch or switches (e.g., switches M1-M4 in FIGS. 5-6) used by passive mixer 216 in main down-conversion path 204-B. The disabled switch or switches used by passive mixer 216 in main down-conversion path 204-B remain open and, therefore, disconnect main down-conversion path 204-B from RF port 902. Controller 1002 can use a control signal Ctrl-B to disable the switch or switches used by passive mixer 216 of main down-conversion path 204-B.

The input impedance of main down-conversion path 204-A as seen by RF port 902 can be increased by controller 1002 in several different ways as well, including by disabling one or more (but not all) unit cells of passive mixer 216 in main down-conversion path 204-A. FIGS. 5 and 6 show two example implementations of passive mixers that can be used to explain the concept of a passive mixer unit cell. Each example passive mixer implementation in FIGS. 5 and 6 can be constructed from multiple such implementations coupled in parallel. For example, two or more of passive mixer implementation 500 in FIG. 5 can be coupled in parallel to construct passive mixer 216. Each such passive mixer implementation 500 coupled in parallel is a unit cell of passive mixer 216 of main down-conversion path 204-B. Each unit cell can be disabled by disabling the switch or switches that the unit cell uses to perform mixing. The more unit cells that are disabled, the higher the input impedance of main down-conversion path 204-A as seen by RF port 902.

In addition, assuming passive mixer 216 of main down-conversion path 204-A is implemented as a harmonic rejection mixer constructed from multiple passive mixers, each such passive mixer of the harmonic rejection mixer can be constructed from multiple unit cells as described above. Controller 1002 can disable one or more unit cells of each passive mixer in the harmonic rejection mixer to increase the input impedance of main down-conversion path 204-A as seen by RF port 902. For example, on the left-side of FIG. 10, an example implementation of passive mixer 216 as an eight-phase passive harmonic rejection mixer constructed from four balanced passive mixers is shown. Each of the four balanced passive mixers is coupled to a control signal Ctrl-A with k-bits. The control signal Ctrl-A is provided by controller 1002 to disable one or more unit cells of each of the four balanced passive mixers to increase the input impedance of main down-conversion path 204-A as seen by RF port 902.

In one embodiment, first mixer-first receiver front-end 904 is configured to down-convert the signal received at RF port 902 from antenna 202 to recover data communicated over a WLAN employing one of the IEEE 802.11 specifications, and second mixer-first receiver front-end 906 is configured to down-convert the signal received at RF port 902 from antenna 202 to recover data communicated over a WPAN employing the Bluetooth specification. For example, first mixer-first receiver front-end 904 can be configured to down-convert the portion of the signal received at RF port 902 from antenna 202 centered in the 2.4 GHz WLAN frequency range and/or in the 5 GHz WLAN frequency range. To provide down-conversion at both 2.4 GHz and 5 GHz, first mixer-first receiver front-end 904 can implement passive mixers 216 in each of its two down-conversion paths as an eight phase passive harmonic rejection mixers. As discussed above in FIG. 4, an eight phase passive harmonic rejection mixer can be used to down-convert a signal at the fundamental frequency of the LO signal that the eight phase passive harmonic rejection mixer receives or at twice the fundamental frequency of the LO signal. Thus, a single LO signal with a fundamental frequency in the range of 2.4-2.5 GHz can be used.

Figure 11:
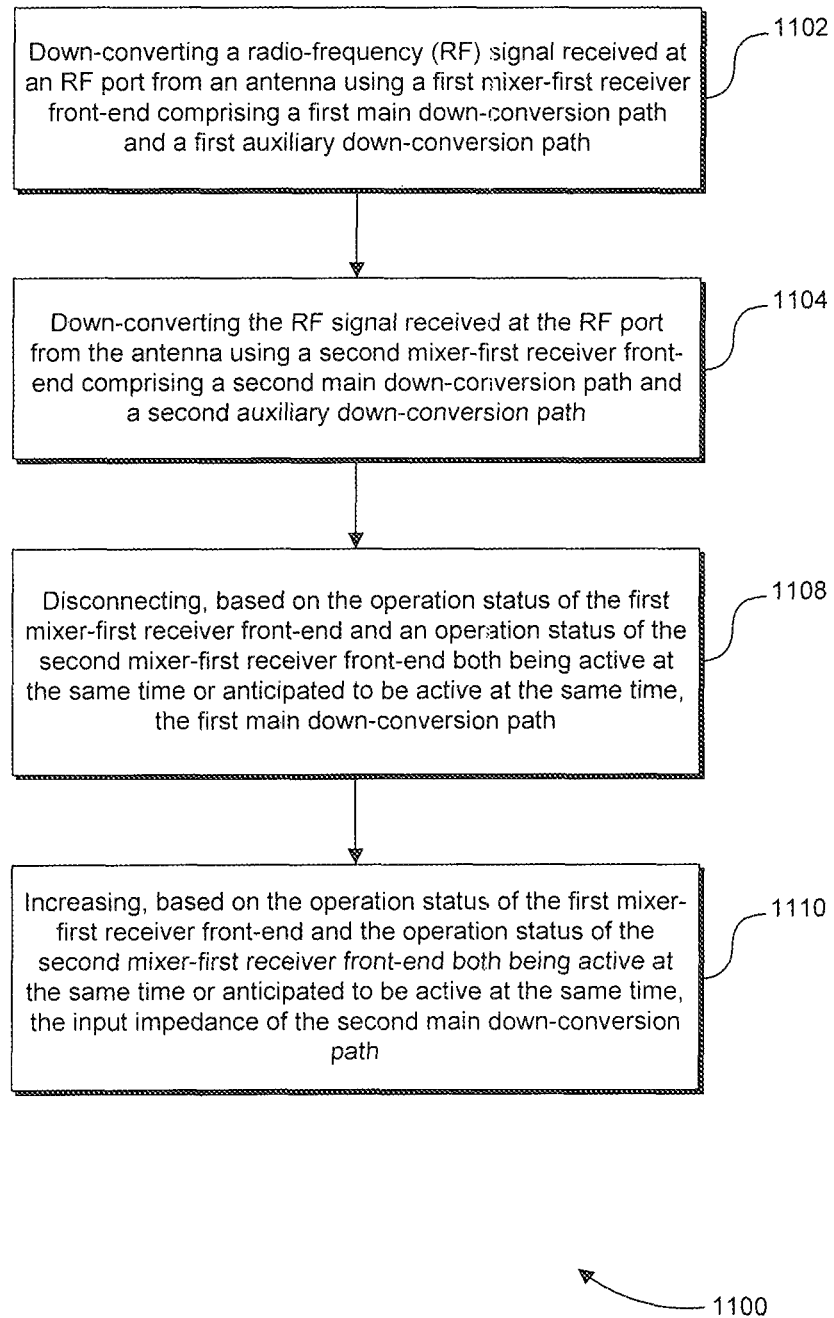
FIG. 11 illustrates a flowchart of an example method for sharing an antenna via a common RF port between two mixer-first receiver front-ends in accordance with embodiments of the present disclosure.

FIG. 11 illustrates a flowchart 1100 of an example method for sharing an antenna via a common RF port between two mixer-first receiver front-ends in accordance with embodiments of the present disclosure. The method of flowchart 1100 can be implemented by system shown in FIG. 10 and FIG. 11. However, as will be appreciated by one of ordinary skill in the art, the method of flowchart 1100 can be implemented by other systems.

The method of flowchart 1100 begins at step 1102. At step 1102, a radio-frequency (RF) signal received at an RF port from an antenna is down-converted using a first mixer-first receiver front-end comprising a first main down-conversion path and a first auxiliary down-conversion path.

At step 1104, the RF signal received at the RF port from the antenna is down-converted using a second mixer-first receiver front-end comprising a second main down-conversion path and a second auxiliary down-conversion path.

At step 1106, the first main down-conversion path is disconnected from the RF port based on an operation status of the first mixer-first receiver front-end and an operation status of the second mixer-first receiver front-end both being active at the same time or anticipated to be active at the same time, the first main down-conversion path from the RF port.

At step 1108, the input impedance of the second main down-conversion path is increased based on the operation status of the first mixer-first receiver front-end and the operation status of the second mixer-first receiver front-end both being active at the same time or anticipated to be active at the same time.

7. CONCLUSION

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

What is claimed is:

1. A system, comprising:
    a first mixer-first receiver front-end configured to down-convert a radio-frequency (RF) signal received at an RF port from an antenna, wherein the first mixer-first receiver front-end comprises a first main down-conversion path and a first auxiliary down-conversion path;
    a second mixer-first receiver front-end configured to down-convert the RF signal received at the RF port from the antenna, wherein the second mixer-first receiver front-end comprises a second main down-conversion path and a second auxiliary down-conversion path; and
    a controller configured to adjust, based on an operation status of the first mixer-first receiver front-end and an operation status of the second mixer-first receiver front-end, an input impedance of the first main down-conversion path and an input impedance of the second main down-conversion path.

2. The system of claim 1, wherein the controller is configured to increase, based on the operation status of the first mixer-first receiver front-end and the operation status of the second mixer-first receiver front-end both being active at the same time or anticipated to be active at the same time, the input impedance of the first main down-conversion path and the input impedance of the second main down-conversion path.

3. The system of claim 2, wherein the controller is configured to increase the input impedance of the first main down-conversion path by disabling a passive mixer in the first main down-conversion path.

4. The system of claim 2, wherein the controller is configured to increase the input impedance of the first main down-conversion path by disabling a passive harmonic rejection mixer in the first main down-conversion path.

5. The system of claim 2, wherein the controller is configured to increase the input impedance of the second main down-conversion path by disabling only a portion of a passive mixer in the second main down-conversion path.

6. The system of claim 5, wherein the controller is configured to disable only the portion of the passive mixer in the second main down-conversion path by disabling one or more unit cells of the passive mixer in the second main down-conversion path.

7. The system of claim 6, wherein the passive mixer in the second main down-conversion path is one passive mixer of a plurality of passive mixers in a passive harmonic rejection mixer.

8. The system of claim 2, wherein:
    the first mixer-first receiver front-end is configured to recover, at least in part, wireless personal area network data traffic in the RF signal, and
    the second mixer-first receiver front-end is configured to recover, at least in part, wireless local area network data traffic in the RF signal.

9. The system of claim 1, wherein:
the first main down-conversion path comprises a first passive mixer configured to mix a current of the RF signal with a local-oscillator (LO) signal to provide a first down-converted signal, and a transimpedance amplifier configured to apply a first gain to the first down-converted signal to provide a first output signal, and
the first auxiliary down-conversion path comprises a transconductance cell configured to convert a voltage of the RF signal into a corresponding current signal, a second passive mixer configured to mix the corresponding current signal with the LO signal to provide a second down-converted signal, and a second transimpedance amplifier configured to apply a second gain to the second down-converted signal to provide a second output signal.

10. The system of claim 9, wherein the first gain is substantially proportional to the second gain.

11. A system, comprising:
a first mixer-first receiver front-end configured to down-convert a radio-frequency (RF) signal received at an RF port from an antenna, wherein the first mixer-first receiver front-end comprises a first main down-conversion path and a first auxiliary down-conversion path;
a second mixer-first receiver front-end configured to down-convert the RF signal received at the RF port from the antenna, wherein the second mixer-first receiver front-end comprises a second main down-conversion path and a second auxiliary down-conversion path; and
a controller configured, based on an operation status of the first mixer-first receiver front-end and an operation status of the second mixer-first receiver front-end both being active at the same time or anticipated to be active at the same time, to disconnect the first main down-conversion path from the RF port and to increase the input impedance of the second main down-conversion path.

12. The system of claim 11, wherein the controller is configured to disconnect the first main down-conversion path from the RF port by disabling a passive mixer in the first main down-conversion path.

13. The system of claim 11, wherein the controller is configured to disconnect the first main down-conversion path from the RF port by disabling a passive harmonic rejection mixer in the first main down-conversion path.

14. The system of claim 11, wherein the controller is configured to increase the input impedance of the second main down-conversion path by disabling only a portion of a passive mixer in the second main down-conversion path.

15. The system of claim 14, wherein the controller is configured to disable only the portion of the passive mixer in the second main down-conversion path by disabling one or more unit cells of the passive mixer in the second main down-conversion path.

16. The system of claim 15, wherein the passive mixer in the second main down-conversion path is one passive mixer of a plurality of passive mixers in a passive harmonic rejection mixer.

17. The system of claim 11, wherein:
the first mixer-first receiver front-end is configured to recover, at least in part, wireless personal area network data traffic in the RF signal, and
the second mixer-first receiver front-end is configured to recover, at least in part, wireless local area network data traffic in the RF signal.

18. The system of claim 11, wherein:
the first main down-conversion path comprises a first passive mixer configured to mix a current of the RF signal with a local-oscillator (LO) signal to provide a first down-converted signal, and a transimpedance amplifier configured to apply a first gain to the first down-converted signal to provide a first output signal, and
the first auxiliary down-conversion path comprises a transconductance cell configured to convert a voltage of the RF signal into a corresponding current signal, a second passive mixer configured to mix the corresponding current signal with the LO signal to provide a second down-converted signal and a second transimpedance amplifier configured to apply a second gain to the second down-converted signal to provide a second output signal.

19. The system of claim 18, wherein the first gain is substantially proportional to the second gain.

20. A method, comprising:
down-converting a radio-frequency (RF) signal received at an RF port from an antenna using a first mixer-first receiver front-end comprising a first main down-conversion path and a first auxiliary down-conversion path;
down-converting the RF signal received at the RF port from the antenna using a second mixer-first receiver front-end comprising a second main down-conversion path and a second auxiliary down-conversion path;
disconnecting, based on an operation status of the first mixer-first receiver front-end and an operation status of the second mixer-first receiver front-end both being active at the same time or anticipated to be active at the same time, the first main down-conversion path from the RF port; and
increasing, based on the operation status of the first mixer-first receiver front-end and the operation status of the second mixer-first receiver front-end both being active at the same time or anticipated to be active at the same time, the input impedance of the second main down-conversion path.

* * * * *